(12) United States Patent
Chen et al.

(10) Patent No.: US 12,432,828 B2
(45) Date of Patent: Sep. 30, 2025

(54) LIGHTING APPARATUS

(71) Applicant: XIAMEN LEEDARSON LIGHTING CO., LTD, Fujian (CN)

(72) Inventors: Yanbiao Chen, Fujian (CN); Liping Lin, Fujian (CN)

(73) Assignee: XIAMEN LEEDARSON LIGHTING CO., LTD, Xiamen (CN)

( * ) Notice: Subject to any disclaimer, the term of this patent is extended or adjusted under 35 U.S.C. 154(b) by 329 days.

(21) Appl. No.: 17/093,106

(22) Filed: Nov. 9, 2020

(65) Prior Publication Data

US 2021/0144825 A1 May 13, 2021

(30) Foreign Application Priority Data

Nov. 11, 2019 (CN) .......................... 201921936866.8

(51) Int. Cl.
| | |
|---|---|
| H05B 45/30 | (2020.01) |
| F21K 9/64 | (2016.01) |
| F21Y 115/10 | (2016.01) |
| H05B 45/10 | (2020.01) |
| H10H 20/851 | (2025.01) |
| H10H 20/857 | (2025.01) |

(52) U.S. Cl.
CPC ............... *H05B 45/30* (2020.01); *F21K 9/64* (2016.08); *H05B 45/10* (2020.01); *H10H 20/851* (2025.01); *H10H 20/857* (2025.01); *F21Y 2115/10* (2016.08)

(58) Field of Classification Search
None
See application file for complete search history.

(56) References Cited

U.S. PATENT DOCUMENTS

| | | | |
|---|---|---|---|
| 10,256,376 B1* | 4/2019 | Chen ..................... | H01L 33/486 |
| 2011/0068698 A1* | 3/2011 | Swoboda ............... | H05B 45/22 |
| | | | 315/153 |
| 2015/0230316 A1* | 8/2015 | Baaijens ................. | G09F 13/00 |
| | | | 315/153 |
| 2016/0062023 A1* | 3/2016 | Itoh ....................... | G02B 6/0026 |
| | | | 362/608 |
| 2018/0295696 A1* | 10/2018 | Li ......................... | A61N 5/0618 |

\* cited by examiner

*Primary Examiner* — Jany Richardson
(74) *Attorney, Agent, or Firm* — LANWAY IPR SERVICES; Chun-Ming Shih

(57) ABSTRACT

A lighting apparatus includes a LED module and a driver. The LED module includes a first LED chip, a second LED chip, a first fluorescent layer, a second fluorescent layer and a package frame. The first LED chip and the second chip are respectively disposed at a first area and a second area of the package frame. The first fluorescent layer covers the first area. The second fluorescent layer covers the second LED chip. The first fluorescent layer and the second fluorescent layer have different types of fluorescent materials. The driver generates a driving current supplied to the LED module so that the LED module emits a first light above the first area and a second light above the second area for generating a mixed light by the first light and the second light.

18 Claims, 10 Drawing Sheets

LIGHTING APPARATUS

FIELD

The present invention is related to a lighting apparatus, and more particularly related to a lighting apparatus with enhanced LED modules.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

To render white light, blue light LED chips may be used by covering a fluorescent layer mixed with red and green fluorescent materials. However, such arrangement is found decreasing color rendering effect.

It is beneficial to find a better way to build a flexible design for better color rendering design that maximizes the usage of the LED technology.

SUMMARY

In some embodiments, a lighting apparatus includes a LED module and a driver.

The LED module includes a first LED chip, a second LED chip, a first fluorescent layer, a second fluorescent layer and a package frame.

The first LED chip and the second chip are respectively disposed at a first area and a second area of the package frame.

The first fluorescent layer covers the first area.

The second fluorescent layer covers the second LED chip.

The first fluorescent layer and the second fluorescent layer have different types of fluorescent materials.

The driver generates a driving current supplied to the LED module so that the LED module emits a first light above the first area and a second light above the second area for generating a mixed light by the first light and the second light.

In some embodiments, the first LED chip and the second LED chip are the same type of LED chip.

In some embodiments, the first LED chip and the second LED chip are blue light LED chips.

In some embodiments, the first fluorescent layer is red fluorescent layer and the second fluorescent layer is a green fluorescent layer.

In some embodiments, a first excitation wavelength of the red fluorescent layer is between 350 to 600 nm. A second excitation wavelength of the green fluorescent layer is between 350-530 nm.

In some embodiments, there is an opaque layer to isolate the first fluorescent layer and the second fluorescent layer.

In some embodiments, the first LED chip and the second LED chip are separately connected to the driver to be controlled by the driver separately.

In some embodiments, a first output intensity of the first LED chip is different from a second output intensity of the second LED chip.

In some embodiments, the driver controls and adjusts the first output intensity and the second output intensity to generate different required mixed lights.

In some embodiments, there are multiple first LED chips disposed at the first area of the package frame.

In some embodiments, the package frame has two isolated pads for respectively mounting at least one of the multiple first LED chips.

In some embodiments, the lighting apparatus may also include a red LED module for emitting a red light, a blue LED module for emitting a blue light and a green LED module for emitting a green light.

The driver controls the red light, the blue light and the green light to mix with the mixed light fora required parameter.

In some embodiments, the driver has a first adjusting circuit for controlling and adjusting currents separately supplied to the first LED chip and the second LED chip.

The driver has a second adjusting circuit for controlling and adjusting currents separately supplied to the red LED module, the blue LED module and the green LED module.

In some embodiments, the lighting apparatus may also include a white LED module for generating a white light with a white color temperature to be mixed with the mixed light for adjusting an overall color temperature.

In some embodiments, there are a plurality of the LED modules.

Each first LED chip of the plurality of the LED modules are connected in series as a first series to the driver.

Each second LED chip of the plurality of the LED modules are connected in series a second series to the driver.

The driver controls the first series and the second series separately.

In some embodiments, the driver controls the first LED chip and the second LED chip separately by reference to a required color rendering parameter.

In some embodiments, the driver stores multiple control settings.

Each control setting is corresponding to one required color rendering parameter optimized for a corresponding object type.

In some embodiments, the object type is assigned by an external device by sending a wireless command to the driver.

In some embodiments, the object type is selected by manually operating a switch on a housing of the lighting apparatus.

In some embodiments, the package frame has a first reflector structure and a second reflector structure.

The first reflector structure is disposed on the first area for filling the first fluorescent layer.

The second reflector structure is disposed on the second area for filling the second fluorescent layer.

The first reflector structure is isolated from the second reflector structure.

DETAILED DESCRIPTION

Figure 13:
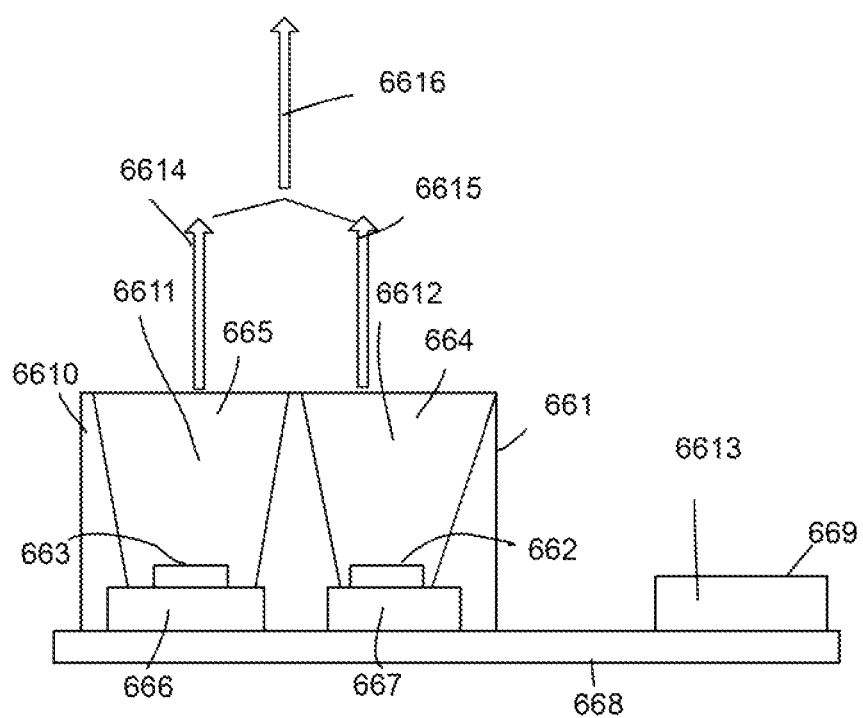
FIG. 13 illustrates an embodiment of a lighting apparatus.

In FIG. 13, a lighting apparatus includes a LED module 661 and a driver 669. LED refers to Light Emitted Diode, which is a technology for converting electricity to light with semiconductor components.

The LED module 661 includes a first LED chip 662, a second LED chip 663, a first fluorescent layer 664, a second fluorescent layer 665 and a package frame 6610.

The first LED chip 662 and the second chip 663 are respectively disposed at a first area 6612 and a second area 6611 of the package frame 6610.

The first fluorescent layer 664 covers the first area 6612.

The second fluorescent layer 665 covers the second LED chip 663.

The first fluorescent layer 664 and the second fluorescent layer 665 have different types of fluorescent materials.

In some embodiments, the first fluorescent layer 664 may include red fluorescent powder mixed in transparent silica gel, and excitation wavelength of the red fluorescent powder is between 350 to 600 nm.

The red fluorescent power may include CASN ($CaAlSiN_3$:Eu)和 SCASN(($Sr, Ca)AlSiN_3$:Eu).

The second fluorescent layer 665 may include green fluorescent powder mixed in transparent silica gel. The excitation wavelength of the green fluorescent powder is between 350 to 530 nm.

The green fluorescent powder may include LuAG ($Lu_3Al_5O_{12}$:Ce)和 GYAG(Y, Ge)3(Al, Ga).

The driver 669 generates a driving current 6613 supplied to the LED module 661 so that the LED module 661 emits a first light 6615 above the first area 6612 and a second light 6614 above the second area 6611 for generating a mixed light 6616 by the first light 6615 and the second light 6614.

In some embodiments, the first LED chip 662 and the second LED chip 663 are the same type of LED chip. For example, they have the same electronic and chemical parameters, e.g. both are the same blue light LED chip. By covering different fluorescent layers over the same LED chips, different lights may be outputted even using the same type of LED chips.

In some embodiments, the first LED chip 662 and the second LED chip 663 are blue light LED chips that emits blue lights.

In some embodiments, the first fluorescent layer is red fluorescent layer and the second fluorescent layer is a green fluorescent layer, as explained above.

In some embodiments, a first excitation wavelength of the red fluorescent layer is between 350 to 600 nm. A second excitation wavelength of the green fluorescent layer is between 350-530 nm.

In some embodiments, there is an opaque layer to isolate the first fluorescent layer and the second fluorescent layer. With the opaque layer, light passing within the fluorescent layers do not move cross to another area to increase light efficiency also to increase color rendering capability found under experiments of inventors.

In some embodiments, the first LED chip 662 and the second LED chip 663 are separately connected to the driver 669 to be controlled by the driver 669 separately. For example, the driver 669 is mounted on a light source plate 668. There are conductive path layers disposed on the light source plate 668 for routing electricity separately to the first LED chip 662 and the second LED chip 663.

In some embodiments, a first output intensity of the first LED chip 662 is different from a second output intensity of the second LED chip 663. For example, even the first LED chip 662 and the second LED chip 663 are the same type LED chips, they are supplied with different amount of currents to control their light output intensities. By controlling the ratio between output intensities of the first LED chip 662 and the second LED chip 663, a required mixed output light may be adjusted for its color temperature and/or color.

In some embodiments, the driver 669 controls and adjusts the first output intensity and the second output intensity to generate different required mixed lights.

In some embodiments, there are multiple first LED chips disposed at the first area of the package frame. For example, in FIG. 14, there are two first LED chips 673, 674 placed in the first area 671 of the package frame 678. There are three LED chips 675, 676, 677 placed in the second area 672 of the package frame 678. Other combination may be used.

In some embodiments, there are more than two areas respectively placed with LED chips filled with different fluorescent layers to generate the different output lights on different areas. The same concept mentioned above may also be applied to such embodiments.

Figure 16:
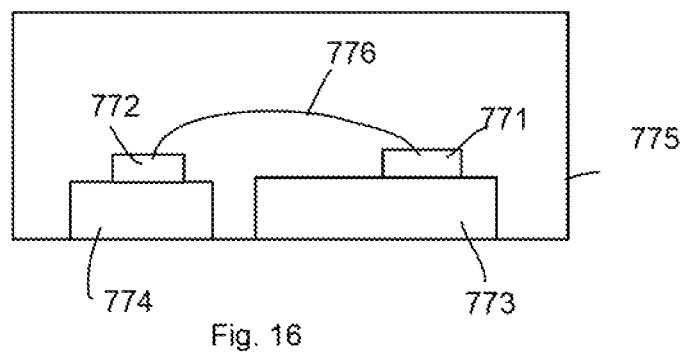
FIG. 16 illustrates two pads mounted with LED chips.

In FIG. 16, the package frame 775 has two isolated pads 773, 774 for respectively mounting at least one of the multiple first LED chips 771, 772. Specifically, there are two first LED chips 771, 772 connected in series with a wire 776. The two isolated pads 773, 774 are made of electricity conductive material like metal for routing electricity to the two first LED chips 771, 772. Such arrangement makes heat dissipation more efficient, increasing life span of the LED chips. In addition, such arrangement is found making light output pattern more even.

Figure 14:
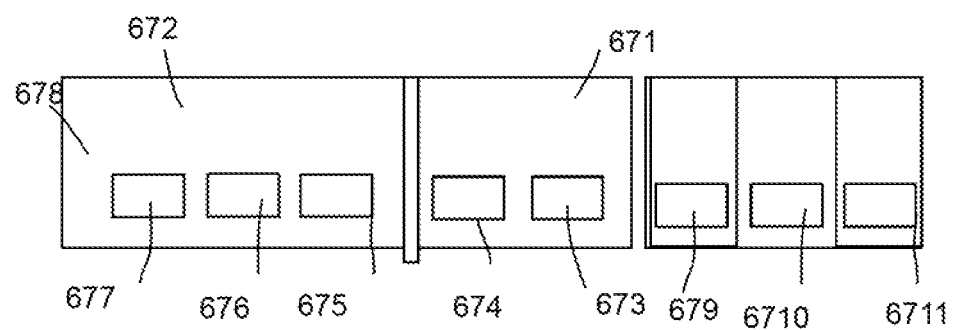
FIG. 14 illustrates components in an embodiment.

In FIG. 14, the lighting apparatus may also include a red LED module 679 for emitting a red light, a blue LED module 6710 for emitting a blue light and a green LED module 6711 for emitting a green light.

The driver controls the red light, the blue light and the green light to mix with the mixed light fora required parameter.

Figure 11:
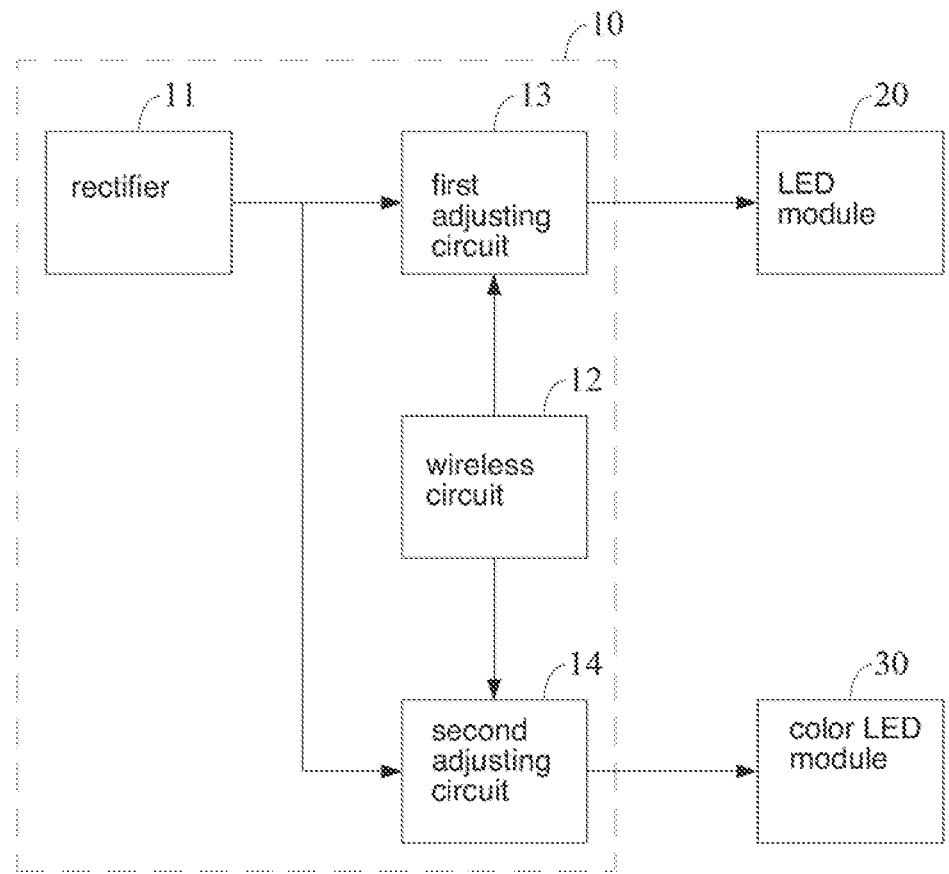
FIG. 11 illustrates another circuit diagram of an embodiment.

In FIG. 11, the driver 10 has a first adjusting circuit 13 for controlling and adjusting currents separately supplied to the first LED chip and the second LED chip that is integrated as a LED module 20.

The driver 10 has a second adjusting circuit 14 for controlling and adjusting currents separately supplied to the red LED module, the blue LED module and the green LED module that are integrated as a color LED module 30.

In some embodiments, the lighting apparatus may also include a white LED module for generating a white light with a white color temperature to be mixed with the mixed light for adjusting an overall color temperature. The white LED module is not particularly illustrated in the drawings but may be placed on the same light source plate as the LED module mentioned above, which should be known to persons of ordinary skilled in the art.

Figure 17:
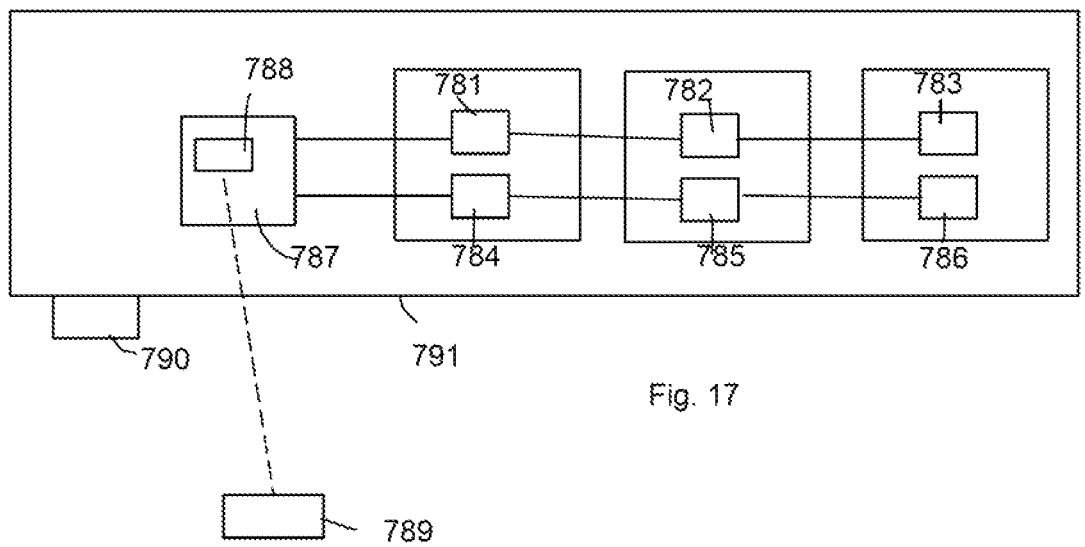
FIG. 17 illustrates multiple LED chips connected in series.

In FIG. 17, there are a plurality of the LED modules.

Each first LED chip 781, 782, 783 of the plurality of the LED modules are connected in series as a first series to the driver 787.

Each second LED chip 784, 785, 786 of the plurality of the LED modules are connected in series a second series to the driver 787.

The driver 787 controls the first series and the second series separately.

In some embodiments, the driver controls the first LED chip and the second LED chip separately by reference to a required color rendering parameter. When people see objects, they see the lights not absorbed or reflected by the objects. When different lights are emitted on these objects, visual difference may be created. Sometimes, we want to render the visual image of the objects by enhancing or emphasizing certain frequency areas. This can be found by experts sensitive to colors and then related light parameters are recorded and stored when these parameters are optimized for different objects.

For example, a first light parameters may be optimized for emitting lights on a diamond while a second different light parameters may be optimized for emitting lights on meat or vegetable.

In some embodiments, the driver 787 stores multiple control settings 788, e.g. in a nonvolatile memory.

Each control setting is corresponding to one required color rendering parameter optimized for a corresponding object type.

In FIG. 17, the object type is assigned by an external device 789 by sending a wireless command to the driver 787.

In FIG. 17, the object type is selected by manually operating a switch 790 on a housing 791 of the lighting apparatus.

Figure 15:
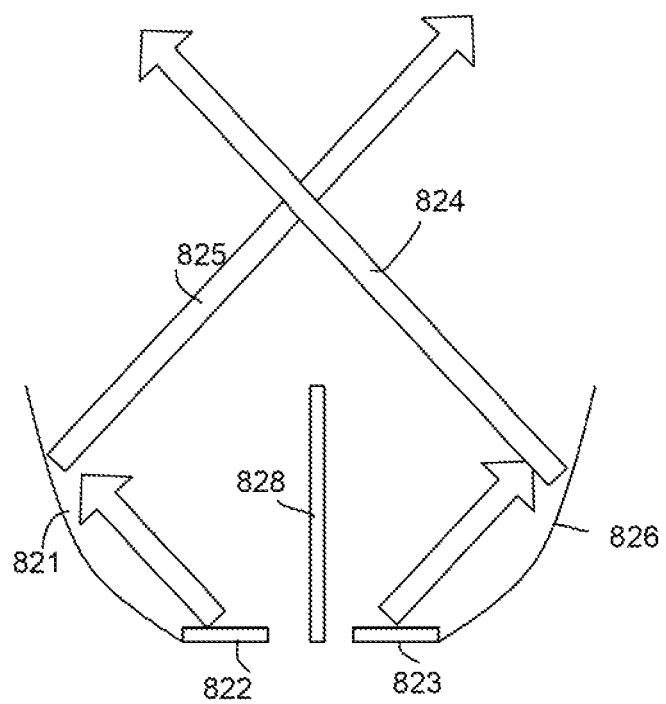
FIG. 15 illustrates reflective structures.

In FIG. 15, the package frame has a first reflector structure 821 and a second reflector structure 826. The reflective structures 821, 826 may be added with a reflective material on their surface for reflecting lights to output surface.

In some embodiments, the first reflective structure 821 and the second reflective structure 826 are arranged, e.g. with a semi-bowl curve surface for guiding reflected lights 824, 825 of the first LED chip 822 and the second LED chip 823 to overlap with a desired range. Specifically, there is still an opaque layer 828 to prevent lights to get cross to another area while moving inside the fluorescent layers but are overlapped for getting a better mixed effect.

The first reflector structure is disposed on the first area for filling the first fluorescent layer.

The second reflector structure is disposed on the second area for filling the second fluorescent layer.

The first reflector structure is isolated from the second reflector structure.

Figure 1:
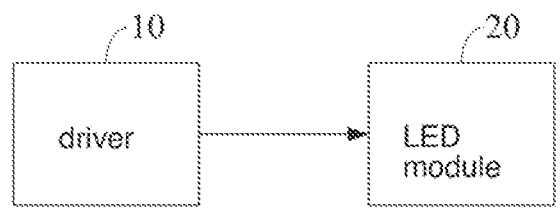
FIG. 1 illustrates an embodiment of a lighting apparatus.

Please refer to FIG. 1. In FIG. 1, a driver 10 is disposed for providing a driving current to a LED module 20.

Figure 2A:
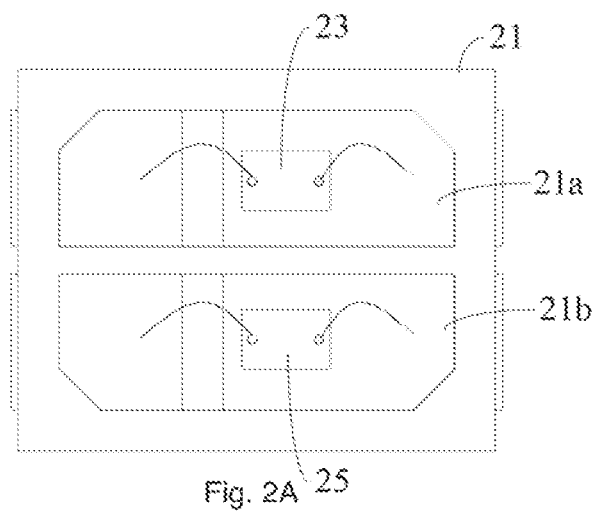
FIG. 2A illustrates a LED module embodiment.

Please refer to FIG. 2A. A LED module 21 has a first area 21a filled with a first fluorescent layer covering a first LED chip 23. The LED module 21 also has a second area 21b filed with a second fluorescent layer covering a second LED chip 25.

Figure 2B:
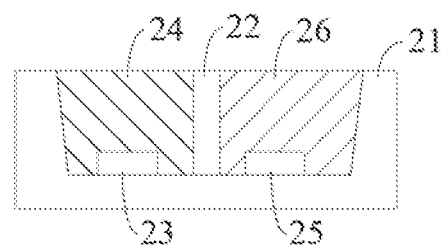
FIG. 2B illustrates a cross sectional view of the example in FIG. 2.

Please refer to FIG. 2B. In FIG. 2B, another view point of the example in FIG. 2A is illustrated. There is an opaque layer 22 for isolating the first fluorescent layer 24 covering the first LED chip 23 and the second fluorescent layer 26 covering the second LED chip 25.

Figure 3:
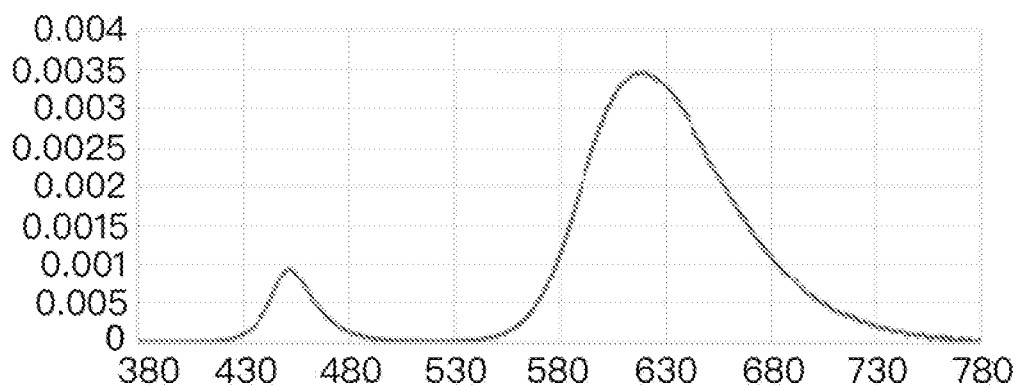

FIG. 3 is an optical diagram showing an example of a red fluorescent layer while the x-axis refers to wavelength and the y-axis refers to intensity.

Figure 4:
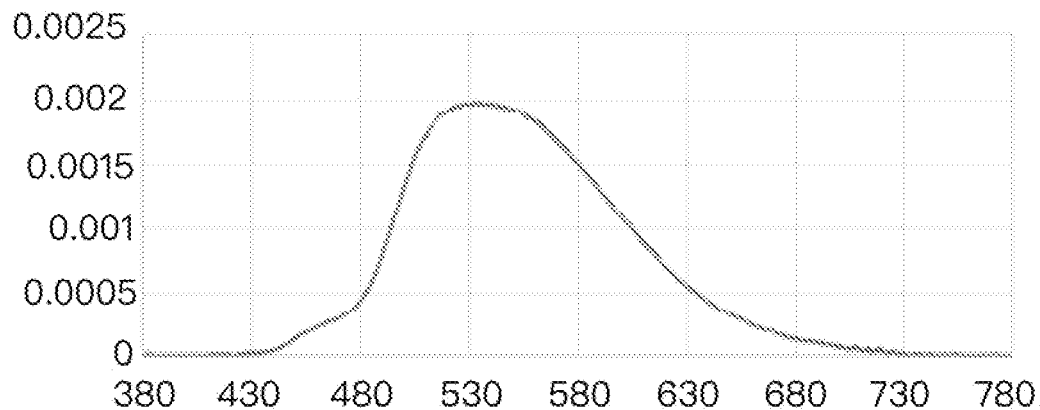
FIG. 4 illustrates a optical diagram.

FIG. 4 is an optical diagram showing an example of a green fluorescent layer while the x-axis refers to wavelength and the y-axis refers to intensity.

Figure 5:
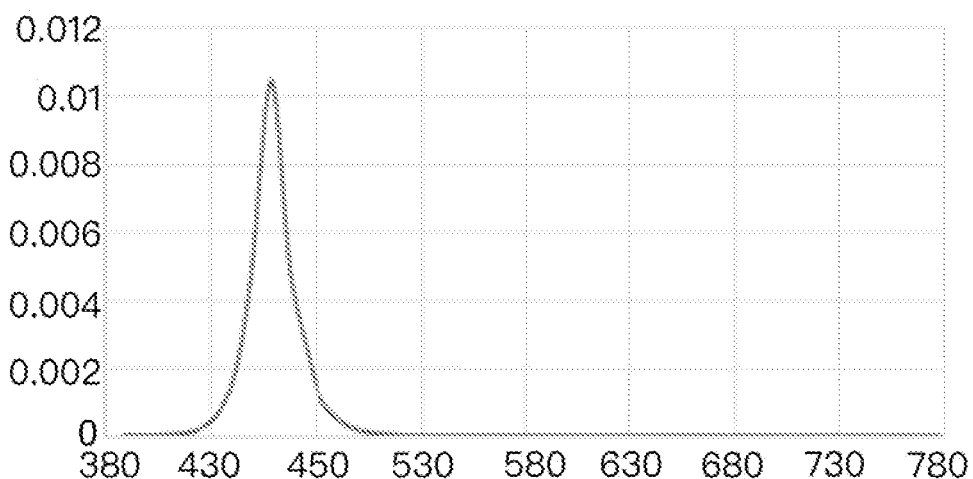
FIG. 5 illustrates another optical diagram.
Figure 6:
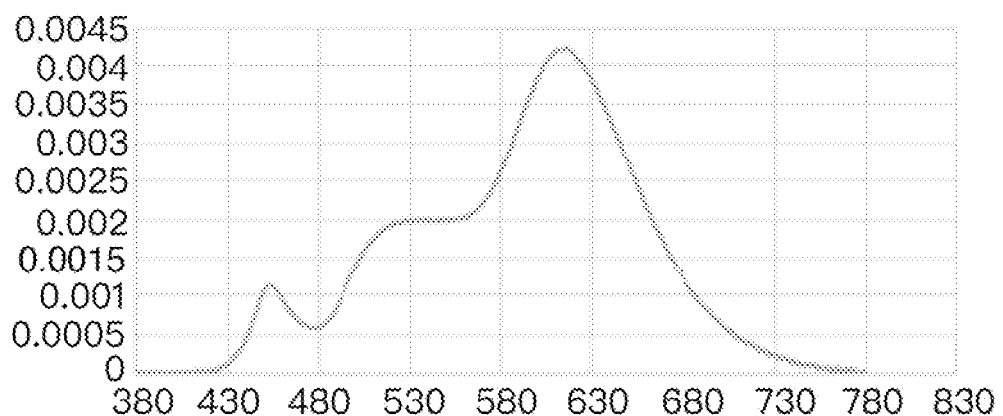
FIG. 6 illustrates another optical diagram.
Figure 7:
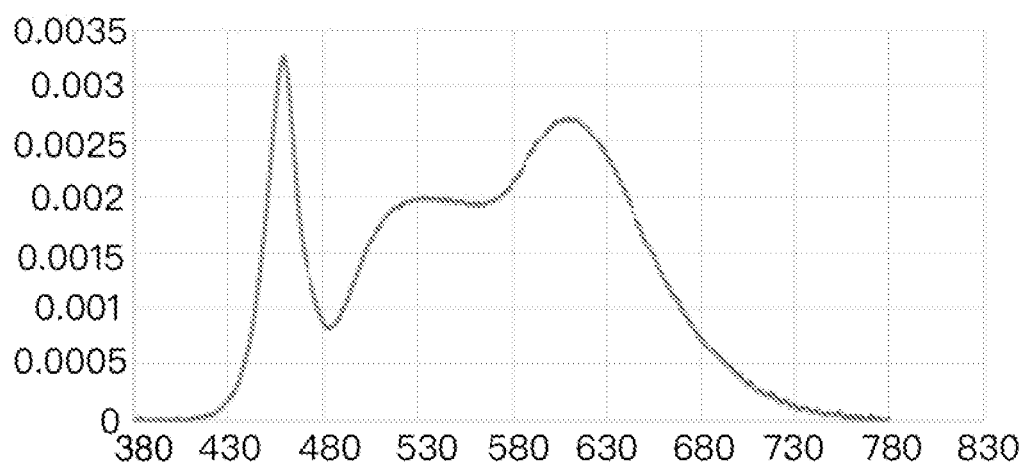
FIG. 7 illustrates another optical diagram.

FIG. 5, FIG. 6 and FIG. 7 similar to the examples in FIG. 3 and FIG. 4, show other material options that may be used for generating the similar structure as mentioned above.

Figure 8:
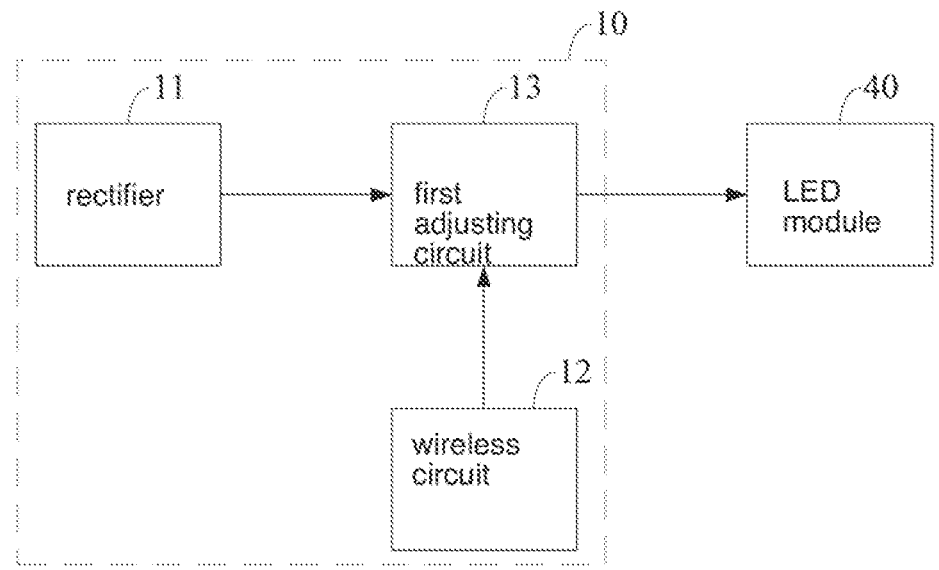
FIG. 8 illustrates a circuit diagram of an embodiment.

FIG. 8 shows a circuit diagram of an embodiment. In FIG. 8, the driver 10 includes a rectifier for rectifying an alternating current power source. The current generated by the rectifier 11 is adjusted by the first adjusting circuit 13 which receives commands from a wireless circuit 12 that parses and decodes an external command from an external device as mentioned above. The first adjusting circuit 13 controls the LED module 40 to mix a required light, e.g. different ratios between the first area and the second area.

Figure 9:
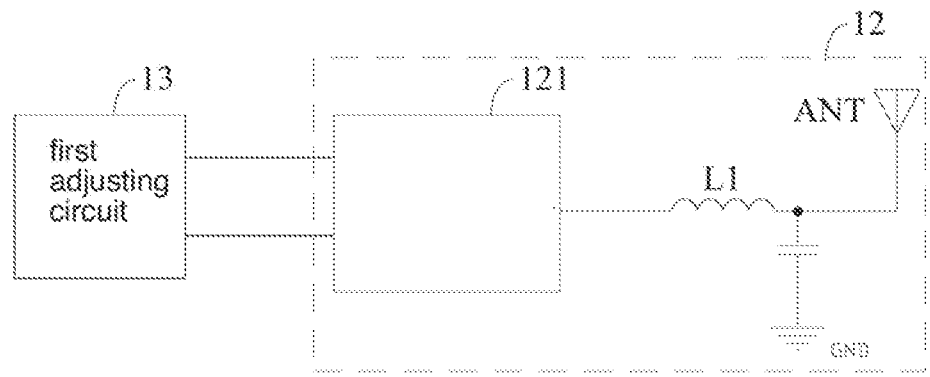
FIG. 9 illustrates another circuit diagram of an embodiment.

FIG. 9 shows another circuit diagram in which the first adjusting circuit 13 is connected to a wireless component 121 that is further connected to an antenna ANT via a inductor L1 forming the wireless circuit 12.

Figure 10:
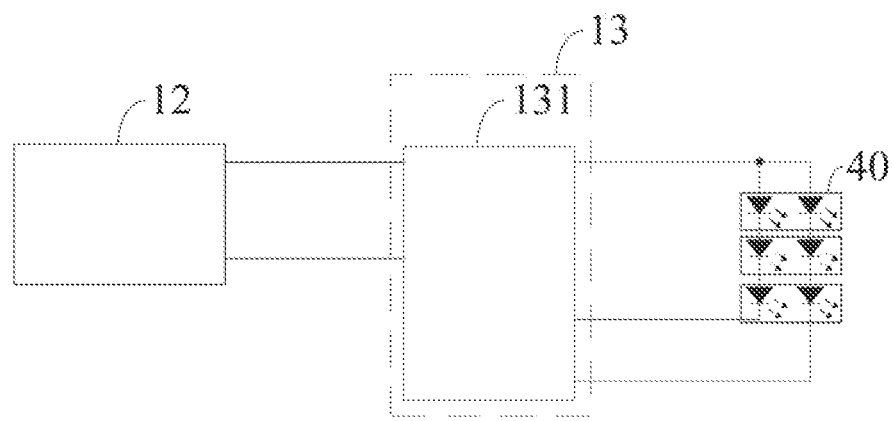
FIG. 10 illustrates another circuit diagram of an embodiment.

FIG. 10 shows another view of the example in FIG. 8 and FIG. 9. In FIG. 10, the first adjusting circuit 13 has a processor 131 that reads a setting from a memory, as an example mentioned above.

FIG. 11 shows another embodiment. In FIG. 11, the driver 10 has a rectifier 11, a first adjusting circuit 13, a wireless circuit 12, a second adjusting circuit 14. The first adjusting circuit 13 controls the LED module 20. The second adjusting circuit 14 controls the color LED module 30.

Figure 12:
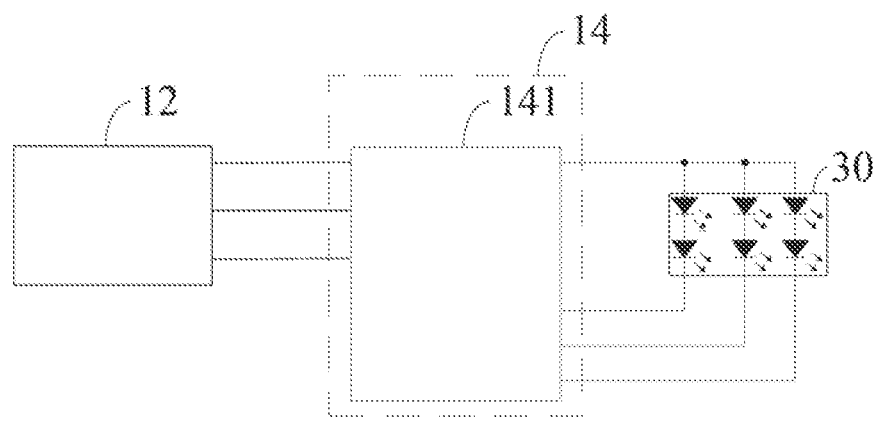
FIG. 12 illustrates another circuit diagram of an embodiment.

FIG. 12 shows another diagram. In FIG. 12, the wireless circuit 12 is connected to a processor 141 in the second adjusting circuit 14 for controlling the color LED module 30 for mixing a required color.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus comprising:
a LED module, comprising a first LED chip, a second LED chip, a first fluorescent layer, a second fluorescent layer and a package frame, wherein the first LED chip and the second LED chip are respectively disposed at a first area and a second area of the package frame, the first fluorescent layer covers the first area, the second fluorescent layer covers the second LED chip, the first fluorescent layer and the second fluorescent layer comprise different types of fluorescent materials;
a housing for storing the LED module;
a switch disposed on the housing; and
a driver for generating a driving current supplied to the LED module so that the LED module emits a first light above the first area and a second light above the second area for generating a mixed light by the first light and the second light, wherein the driver controls the first LED chip and the second LED chip separately by reference to a required color rendering parameter optimized for an object type to be illuminated by the first light and the second light, wherein the object type is selected by manually operating the switch on the housing without using a detector for detecting the object type, wherein the object type is a specific product category instead of an abstract setting for emphasizing or deemphasizing a color on a target surface.

2. The lighting apparatus of claim 1, wherein the first LED chip and the second LED chip are the same type of LED chip.

3. The lighting apparatus of claim 1, wherein the first LED chip and the second LED chip are blue light LED chips.

4. The lighting apparatus of claim 3, wherein the first fluorescent layer is red fluorescent layer and the second fluorescent layer is a green fluorescent layer.

5. The lighting apparatus of claim 4, wherein a first excitation wavelength of the red fluorescent layer is between 350 to 600 nm, and a second excitation wavelength of the green fluorescent layer is between 350-530 nm.

6. The lighting apparatus of claim 1, wherein there is an opaque layer to isolate the first fluorescent layer and the second fluorescent layer.

7. The lighting apparatus of claim 1, wherein the first LED chip and the second LED chip are separately connected to the driver to be controlled by the driver separately.

8. The lighting apparatus of claim 1, wherein a first output intensity of the first LED chip is different from a second output intensity of the second LED chip.

9. The lighting apparatus of claim 8, wherein the driver controls and adjusts the first output intensity and the second output intensity to generate different required mixed lights.

10. The lighting apparatus of claim 1, wherein there are multiple first LED chips disposed at the first area of the package frame.

11. The lighting apparatus of claim 10, wherein the package frame has two isolated pads for respectively mounting at least one of the multiple first LED chips.

12. The lighting apparatus of claim 1, further comprising a red LED module for emitting a red light, a blue LED module for emitting a blue light and a green LED module for emitting a green light, wherein the driver controls the red light, the blue light and the green light to mix with the mixed light for a required parameter.

13. The lighting apparatus of claim 12, wherein the driver has a first adjusting circuit for controlling and adjusting currents separately supplied to the first LED chip and the second LED chip, and the driver has a second adjusting circuit for controlling and adjusting currents separately supplied to the red LED module, the blue LED module and the green LED module.

14. The lighting apparatus of claim 12, further comprising a white LED module for generating a white light with a white color temperature to be mixed with the mixed light for adjusting an overall color temperature.

15. The lighting apparatus of claim 1, wherein there are a plurality of the LED modules, each first LED chip of the plurality of the LED modules are connected in series as a first series to the driver, each second LED chip of the plurality of the LED modules are connected in series a second series to the driver, the driver controls the first series and the second series separately.

16. The lighting apparatus of claim 1, wherein the driver stores multiple control settings, each control setting is corresponding to one required color rendering parameter optimized for a corresponding object type.

17. The lighting apparatus of claim 16, wherein the object type is assigned by an external device by sending a wireless command to the driver.

18. The lighting apparatus of claim 1, wherein the package frame has a first reflector structure and a second reflector structure, the first reflector structure is disposed on the first area for filling the first fluorescent layer, the second reflector structure is disposed on the second area for filling the second fluorescent layer, the first reflector structure is isolated from the second reflector structure.

\* \* \* \* \*